(12) United States Patent
Yamakawa et al.

(10) Patent No.: US 8,525,605 B2
(45) Date of Patent: Sep. 3, 2013

(54) OSCILLATOR

(75) Inventors: Takehiko Yamakawa, Osaka (JP); Kunihiko Nakamura, Osaka (JP); Keiji Onishi, Osaka (JP)

(73) Assignee: Panasonic Corporation, Osaka (JP)

( * ) Notice: Subject to any disclaimer, the term of this patent is extended or adjusted under 35 U.S.C. 154(b) by 51 days.

(21) Appl. No.: 13/322,263

(22) PCT Filed: Mar. 3, 2011

(86) PCT No.: PCT/JP2011/001243
§ 371 (c)(1),
(2), (4) Date: Nov. 23, 2011

(87) PCT Pub. No.: WO2012/017572
PCT Pub. Date: Feb. 9, 2012

(65) Prior Publication Data
US 2012/0182077 A1    Jul. 19, 2012

(30) Foreign Application Priority Data
Aug. 6, 2010  (JP) .................................. 2010-177556

(51) Int. Cl.
*H03B 5/30*    (2006.01)

(52) U.S. Cl.
USPC .................. 331/154; 331/116 M; 331/116 R; 331/175; 331/183

(58) Field of Classification Search
USPC ............... 331/10, 11, 18, 34, 46, 47, 48, 154, 331/175, 177 R, 182, 183, 116 M, 116 R
See application file for complete search history.

(56) References Cited

U.S. PATENT DOCUMENTS 6,278,338 B1 * 8/2001 Jansson .................... 331/116 FE
6,741,137 B1 * 5/2004 Sibrai et al. ................... 331/109

(Continued)

FOREIGN PATENT DOCUMENTS

JP    2007-518351    7/2007
JP    2008-311884    12/2008

(Continued)

OTHER PUBLICATIONS

International Search Report issued Apr. 5, 2011 in International (PCT) Application No. PCT/JP2011/001243.
International Preliminary Report on Patentability issued Mar. 21, 2013 in International Application No. PCT/JP2011/001243.

*Primary Examiner* — Joseph Chang
*Assistant Examiner* — Jeffrey Shin
(74) *Attorney, Agent, or Firm* — Wenderoth, Lind & Ponack, L.L.P.

(57) ABSTRACT

A MEMS oscillator including: an oscillator unit being capable of outputting an output from an amplifier as an original oscillator signal that includes a feedback type oscillator circuit including a MEMS resonator and an amplifier, and an automatic gain controller receiving the output from the amplifier and controlling a gain of the amplifier based on a level of the output to maintain a level of the output from the amplifier constant; and a corrector unit that receives the original oscillator signal, that generates from the original oscillator signal a signal of a predetermined set frequency, and that outputs the generated signal of the predetermined set frequency as an output signal. The corrector unit receives, separately from the original oscillator signal, an information signal that includes a signal having a correspondence relationship between a gain at a resonance frequency of the MEMS resonator from the oscillator unit, corrects a frequency of the original oscillator signal based on the information signal to generate the signal of the predetermined set frequency, and outputs the generated signal of the predetermined set frequency as the output signal.

8 Claims, 18 Drawing Sheets

(56) References Cited

U.S. PATENT DOCUMENTS

| | | | |
|---|---|---|---|
| 2005/0151592 A1* | 7/2005 | Partridge et al. | 331/16 |
| 2007/0257728 A1* | 11/2007 | Boser et al. | 327/528 |
| 2009/0212877 A1 | 8/2009 | Ogasawara | |
| 2009/0267700 A1* | 10/2009 | Mohanty et al. | 331/175 |
| 2011/0122973 A1 | 5/2011 | Tsukio et al. | |

FOREIGN PATENT DOCUMENTS

| | | |
|---|---|---|
| JP | 2009-200888 | 9/2009 |
| WO | 2009/101791 | 8/2009 |

* cited by examiner

OSCILLATOR

TECHNICAL FIELD

The technical field relates to an oscillator, and in particular, to an oscillator using a MEMS resonator.

BACKGROUND ART

Conventionally, an oscillator is used to time (synchronize) operation of circuits in an electronic device or the like. The oscillator capable of accurately outputting an electric signal used as a reference of operation is an indispensable device for such an electronic device. A crystal oscillator using a crystal resonance unit is one example of such an oscillator. However, the crystal oscillator involves problems such as: difficulty in achieving miniaturization, unsuitability for integration, numerous experimental production steps, poor yields, and required long time for delivery. Hence, in recent years, an oscillator that uses micro electro-mechanical systems (MEMS: Micro Electro-Mechanical Systems) prepared through a semiconductor process with silicon or the like is drawing attention as a device that replaces the crystal oscillator.

The micro electro-mechanical oscillator (referred to as the "MEMS oscillator", hereinafter,) includes a feedback type oscillator circuit structured with an amplifier circuit and a MEMS resonator. The MEMS resonator exhibits a significantly improved electrical pass characteristic between the input and output electrodes, as to only an electric signal of a frequency near a specific frequency, i.e., the resonance frequency of the MEMS vibrator (natural frequency of the vibrator). In the MEMS oscillator, using such a characteristic of the MEMS vibrator, an oscillating state is created by feeding back an electric signal of a resonance frequency included in the output from the amplifier circuit to the amplifier circuit. Then, the MEMS oscillator outputs the electric signal having been output from the amplifier circuit in the oscillating state as an oscillator signal. Accordingly, the frequency of the oscillator signal output from the MEMS oscillator is determined based on the resonance frequency of the MEMS vibrator.

It is known that the resonance frequency of the MEMS resonator has temperature dependence. The MEMS resonator is generally formed with silicon or the like, and due to the temperature characteristic of silicon, its resonance frequency has a temperature characteristic of about −20 [ppm/degree Celsius]. For example, when the operating temperature changes by 100 degrees Celsius from −20 to +80 degrees Celsius, the resonance frequency changes by about 2000 [ppm]. Accordingly, in accordance with a change in the operating temperature of the MEMS resonator, the frequency of the oscillator signal similarly changes. Therefore, with a conventional MEMS oscillator, a temperature sensor is disposed near the MEMS resonator, and based on the temperature measured by the temperature sensor, any frequency fluctuation in an oscillator signal due to a temperature dependence of the resonance frequency of the MEMS resonator is compensated for. Thus, irrespective of the temperature, electric signals of a constant frequency are output.

FIG. 21 is a block diagram of a conventional MEMS oscillator. The conventional MEMS oscillator 300 includes an oscillator unit 301 that outputs an original oscillator signal; and a corrector unit 302 that corrects a frequency of the original oscillator signal and outputs it as an output signal having a desired frequency (see PATENT LITERATURE 1).

In the oscillator unit 301, a feedback type oscillator circuit is structured with an amplifier 312 and a MEMS resonator 313, and the output from the amplifier 312 is taken out as an original oscillator signal, and is input into the corrector unit 302.

When the resonance frequency of the MEMS resonator 313 fluctuates due to a change in the temperature or the like, the frequency of the original oscillator signal similarly fluctuates. In the MEMS oscillator 300, by the corrector unit 302 compensating for a fluctuation in the frequency of the original oscillator signal, the frequency of the output signal is maintained constant.

The corrector unit 302 includes a PLL (Phase-Locked Loop) circuit 321, a division ratio controller unit 322 controlling the division ratio of the frequency divider (not shown) disposed at the feedback of the PLL circuit 321, and a temperature sensor 1101.

Based on an input from the temperature sensor 1101, the division ratio controller unit 322 adjusts the division ratio of the frequency divider (not shown) disposed at the feedback of the PLL 321, such that the frequency of the output signal that the PLL 321 outputs attains a desired value. More specifically, the division ratio controller unit 322 determines the division ratio of the frequency divider (not shown) provided at the feedback of the PLL 321 from the temperature characteristic of the known resonance frequency of the MEMS resonator 313, the input from the temperature sensor 1101, and a preset frequency of the output signal.

FIG. 22 is a side cross-sectional view of the MEMS resonator 300 described above. As shown in FIG. 22, the MEMS resonator 313 is packaged such that the surrounding of the vibrator is maintained under vacuum, in order not for the air or the like to affect the mechanical vibration of the vibrator. The MEMS resonator 313 having such a structure is formed as a second chip 1302 which is separate from a first chip 1301 where the amplifier unit 312 and the corrector unit 302 are formed. The temperature sensor 1101 is formed near the MEMS resonator 313 in the first chip 1301.

Then, the first chip 1301 and the second chip 1302 are connected to each other by a metal wire 806 connecting between a pad 604 connected to a wiring 803 extending from the exterior surface of the second chip 1302 to the front layer of the circuit and a pad 805 connected to the first chip 1301, and installed in a cascade manner.

As described above, the surrounding of the vibrator of the MEMS resonator 313 is in a vacuum state. Therefore, the thermal conductivity between the vibrator and the outside is low. Therefore, a difference arises between the temporal fluctuation in the temperature measured by the temperature sensor 1101 of the first chip 1301 and the temporal fluctuation in the actual temperature of the vibrator of the MEMS resonator 313.

FIG. 23 is a graph schematically showing an example of the temporal fluctuation of the temperature measured by the temperature sensor 1101 and that of the actual temperature of the vibrator in the MEMS resonator 313. When a temperature 901 measured by the temperature sensor 1101 fluctuates as shown in FIG. 23, an actual temperature 902 of the vibrator fluctuates to follow the temperature 901, while slightly lagging behind the temperature 901. Therefore, the temperature 901 measured by the temperature sensor 1101 agrees with the actual temperature 902 of the vibrator only at a time period D903 and very limited time points such as time points T904, T905 and T906, and they do not agree with each other at the other time points. In other words, with the structure of the conventional MEMS oscillator 300, it is difficult to accurately compensate for the temperature dependence of the resonance frequency of the MEMS resonator 313 in real time based on the actual temperature of the vibrator, such that output signals of a frequency that accurately agrees with a desired frequency are always output.

CITATION LIST

Patent Literature

PTL 1: JP 2007-518351 A
PTL 2: JP 2008-311884 A

SUMMARY OF INVENTION

Technical Problem

In consideration of the problems in the conventional techniques, a MEMS oscillator that operates stably even when the temperature of the MEMS resonator fluctuates is provided.

Solution to Problem

An aspect is a MEMS oscillator. The MEMS oscillator includes: an oscillator unit being capable of outputting an output from an amplifier as an original oscillator signal that includes a feedback type oscillator circuit including a MEMS resonator and an amplifier, and an automatic gain controller receiving the output from the amplifier and controlling a gain of the amplifier based on a level of the output to maintain a level of the output from the amplifier constant; and a corrector unit that receives the original oscillator signal, that generates from the original oscillator signal a signal of a predetermined set frequency, and that outputs the generated signal of the predetermined set frequency as an output signal. The corrector unit receives, separately from the original oscillator signal, an information signal that includes a signal having a correspondence relationship between a gain at a resonance frequency of the MEMS resonator from the oscillator unit, corrects a frequency of the original oscillator signal based on the information signal to generate the signal of the predetermined set frequency, and outputs the generated signal of the predetermined set frequency as the output signal.

In the aspect, the corrector unit may include a frequency synthesizer including a programmable frequency divider that can variably control a division ratio, and a division ratio controller unit that controls the division ratio of the programmable frequency divider. The division ratio controller unit may control the division ratio of the programmable frequency divider based on the information signal. The frequency synthesizer may receive the original oscillator signal to generate the signal of the predetermined set frequency from the original oscillator signal, and may output the generated signal of the predetermined set frequency as the output signal.

In the aspect, the information signal may be a feedback signal from the MEMS resonator to the amplifier.

In the aspect, the information signal may be a control signal that is output from the automatic gain controller for controlling the gain of the amplifier.

In the aspect, the automatic gain controller may include a peak hold circuit that receives the original oscillator signal and that detects a peak voltage of the original oscillator signal, and a comparator that compares the detected peak voltage and a prescribed reference voltage against each other and that outputs a signal indicative of a result of the comparison. The automatic gain controller may output the signal indicative of the result of the comparison as the control signal, to control the gain of the amplifier.

In the aspect, the corrector unit may further include a second frequency divider that receives the original oscillator signal, that divides a frequency of the original oscillator signal, and that outputs the original oscillator signal of the divided frequency to the frequency synthesizer.

In the aspect, the second frequency divider may be a second programmable frequency divider. In this case, the division ratio controller unit may control a division ratio of the second programmable frequency divider, based on the information signal.

In the aspect, the corrector unit may further include a multiplier that receives the original oscillator signal, that multiplies the original oscillator signal, and that outputs the multiplied original oscillator signal to the frequency synthesizer.

In the aspect, the multiplier may be a programmable multiplier. In this case, the division ratio controller unit may control a multiplication ratio of the programmable multiplier, based on the information signal.

Advantageous Effects of Invention

The MEMS oscillator of the present embodiment can stably output an electric signal of a desired frequency even when the temperature of the MEMS resonator fluctuates.

DESCRIPTION OF EMBODIMENTS

In the following, a detailed description of embodiments are given.

A MEMS oscillator of the present embodiment includes: an oscillator unit including a feedback type oscillator circuit that includes a MEMS resonator, an amplifier, and, an automatic gain controller that controls a gain of the amplifier so as to maintain an output from the amplifier constant; and a corrector unit that generates an output signal of a desired frequency from an original oscillator signal received from the oscillator unit and that outputs the generated signal of the desired frequency.

The corrector unit of the MEMS oscillator of the present embodiment includes: a PLL frequency synthesizer that receives the original oscillator signal and that outputs an output signal; and a division ratio controller unit that controls a division ratio of a programmable frequency divider disposed at the feedback of the PLL frequency synthesizer, based on the gain of the MEMS resonator. As will be described later, since the magnitude of the gain of the MEMS resonator has temperature dependence similarly to the resonance frequency and it monotonously changes in accordance with a change in the temperature, the resonance frequency of the MEMS resonator can be obtained by the magnitude of the gain. Accordingly, the corrector unit controls the division ratio of the programmable frequency divider based on the magnitude of the gain of the MEMS resonator, to thereby maintain the frequency of the output signal from the frequency synthesizer at a desired frequency.

It is to be noted that, the division ratio controller unit receives a signal fed back from the MEMS resonator to the amplifier, and acquires the gain of the MEMS resonator from the level of that signal. Alternatively, the division ratio controller unit receives the control signal (amplitude limiting signal) output from the automatic gain controller for controlling the gain of the amplifier so as to maintain the level of the output from the amplifier constant, and acquires the gain of the MEMS resonator from the amplitude controlling signal.

With such a structure, a MEMS oscillator of the present embodiment is capable of excellently correcting the fluctuation in the frequency of the original oscillator signal due to the temperature dependence of the resonance frequency of the MEMS resonator, thereby outputting output signals of a constant desired frequency.

First Embodiment

1. Structure of MEMS Oscillator

Figure 1:
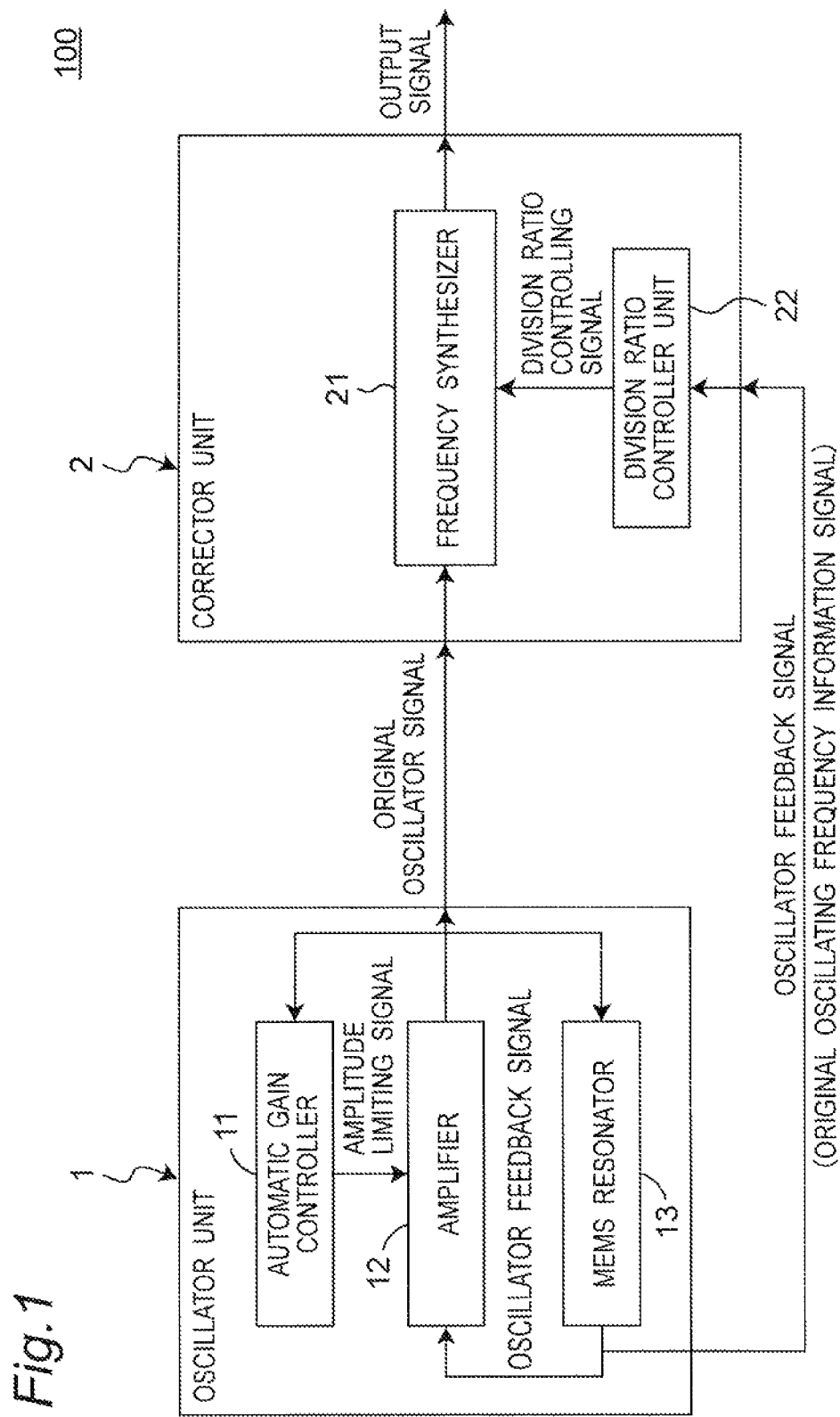
FIG. 1 is a block diagram of a MEMS oscillator according to the first embodiment.

FIG. 1 is a block diagram of a MEMS oscillator according to a first embodiment. A MEMS oscillator 100 includes an oscillator unit 1 that outputs an original oscillator signal, and a corrector unit 2 that receives the original oscillator signal and that outputs an output signal having a desired frequency.

The oscillator unit 1 includes an automatic gain controller 11, an amplifier 12 that amplifies an input signal (oscillator feedback signal) to a certain level (voltage) under control of the automatic gain controller 11 and that outputs the amplified signal, and a MEMS resonator 13 that receives the output from the amplifier 12 and that returns an oscillator feedback signal to the amplifier 12.

The automatic gain controller 11 receives the output from the amplifier 12, and controls the gain of the amplifier 12 such that the output level of the amplifier 12 is maintained constant. Here, the control signal used for such control is referred to as an amplitude limiting signal. The amplifier 12 receives the feedback signal from the MEMS resonator 13, and under the gain control by the amplitude limiting signal received from the automatic gain controller 11, the amplifier 12 amplifies the feedback signal and outputs the amplified feedback signal. The output (original oscillator signal) from the amplifier 12 is sent to the automatic gain controller 11, the corrector unit 2, and the MEMS resonator 13. The MEMS resonator 13 receives the output from the amplifier 12, and outputs a feedback signal. It is to be noted that, in a case where it may be confused with a feedback signal passing through a feedback circuit of a frequency synthesizer 21 of the corrector unit 2 which will be described later, the feedback signal from the MEMS resonator 13 to the amplifier 12 is particularly referred to as an oscillator feedback signal.

2. Operation of MEMS Oscillator

2.1 Operation of Oscillator Unit

Figure 2:
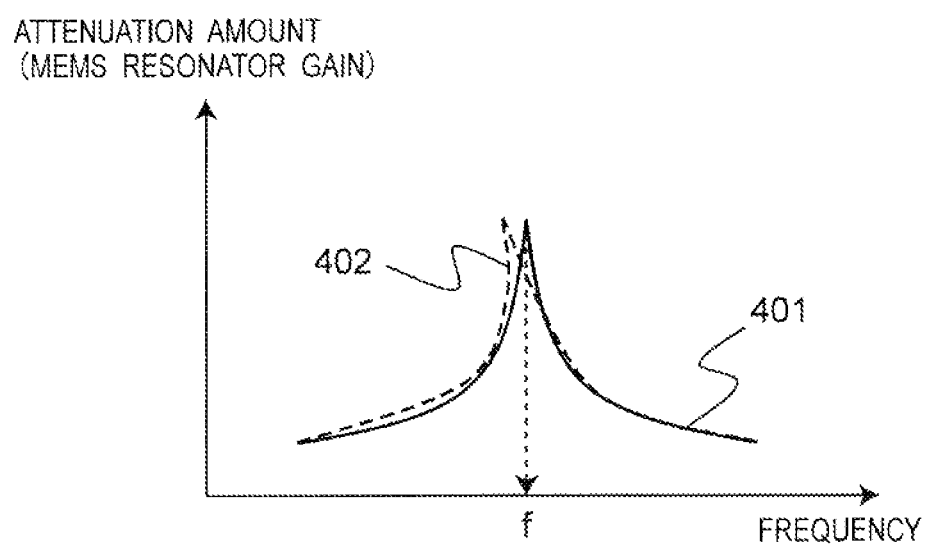
FIG. 2 is a graph of frequency characteristics of an output of the MEMS resonator.

FIG. 2 is a graph showing an electrical pass characteristic (single-pass characteristic) between input and output electrodes of the MEMS resonator 13. In FIG. 2, the horizontal axis represents frequency, and the vertical axis represents attenuation amount (MEMS resonator gain). In a case where the MEMS resonator 13 receives an input of an appropriate level, a pass characteristic 401 that is horizontally symmetrical with reference to a resonance frequency f is exhibited. However, in a case where the MEMS resonator 13 receives an input of an excessive level, a distorted pass characteristic such as a pass characteristic 402 is exhibited. When the MEMS resonator receives such an input of an excessive level, the resonance frequency of the MEMS resonator 13 changes, and becomes unstable. At the same time, Q value becomes poor. In some cases, a vibrator structuring the MEMS resonator 13 is brought into contact with an adjacent excitation electrode disposed with a gap therebetween, and the MEMS resonator 13 is damaged. Accordingly, in order not for the MEMS resonator 13 to receive a signal of an excessive level, the automatic gain controller 11 controls the gain of the amplifier 12 such that the output of the amplifier 12 becomes an appropriate level for the MEMS resonator 13, to thereby maintain the output of the amplifier 12 at a prescribed level. It is to be noted that, an appropriate level for an input to the MEMS resonator 13 is determined by the resonant mode of the MEMS resonator 13, the gap interval between the vibrator and the excitation electrode structuring the MEMS resonator 13, a bias voltage applied to the vibrator and/or the excitation electrode and the like. Generally, it is approximately several tens to several hundreds millivolt.

Figure 3:
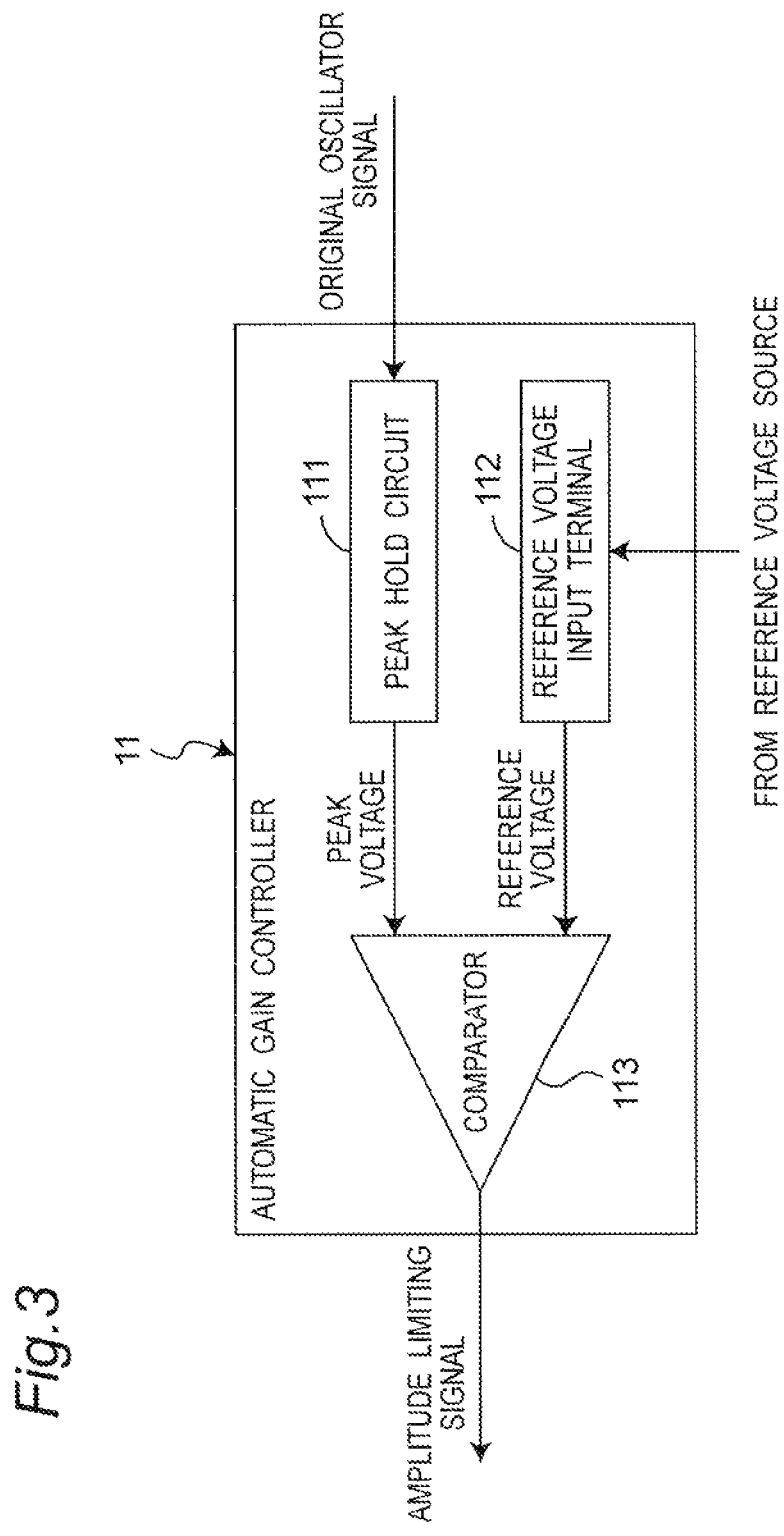
FIG. 3 is a block diagram of an automatic gain controller.

FIG. 3 is a block diagram showing the detail of the automatic gain controller 11. The automatic gain controller (AGC: Automatic Gain Controller) 11 receives an output from the amplifier 12, i.e., an original oscillator signal, and detects the maximum level (peak voltage) of the original oscillator signal at a peak hold circuit 111. Further, to the automatic gain controller 11, a reference voltage is provided from a reference voltage source (not shown) via a reference voltage input terminal 112. The peak voltage and the reference voltage are input into a comparator 113. The comparator 113 compares both the voltages. When the peak voltage is lower than the reference voltage, the comparator 113 outputs an amplitude limiting signal "Low"; conversely, when the peak voltage is higher than the reference voltage, the comparator 113 outputs an amplitude limiting signal "High".

The amplitude limiting signal output from the automatic gain controller 11 is provided to, e.g., the gate of a MOS (Metal Oxide Semiconductor) transistor disposed parallel to the output terminal of the amplifier 12. When the amplitude limiting signal "Low" is input to the gate, the parallel resistance becomes small and the gain of the amplifier 12 increases; conversely, when the amplitude limiting signal "High" is input to the gate, the parallel resistance becomes great and the gain of the amplifier 12 reduces. In this manner, the automatic gain-controller 11 controls the output level from the amplifier 12 in real time, based on the reference voltage. Thus, the output level from the amplifier 12 (which is provided to the MEMS resonator 13) is always maintained at an appropriate level, and hence the normal operation of the MEMS resonator 13 is secured.

It is to be noted that, though the circuit structured with the peak hold circuit 111 and the comparator 113 has been shown as an exemplary structure of the automatic gain controller 11, it is merely one example and the structure of the automatic gain controller 11 is not limited thereto. Any circuit that can control the gain of the amplifier 12 such that the output level (voltage) from the amplifier 12 becomes constant can be used as the automatic gain controller 11. For example, it may be a circuit that controls the amplifier 12 by specifically specifying a value of the gain of the amplifier 12 as an amplitude limiting signal.

Figure 4:
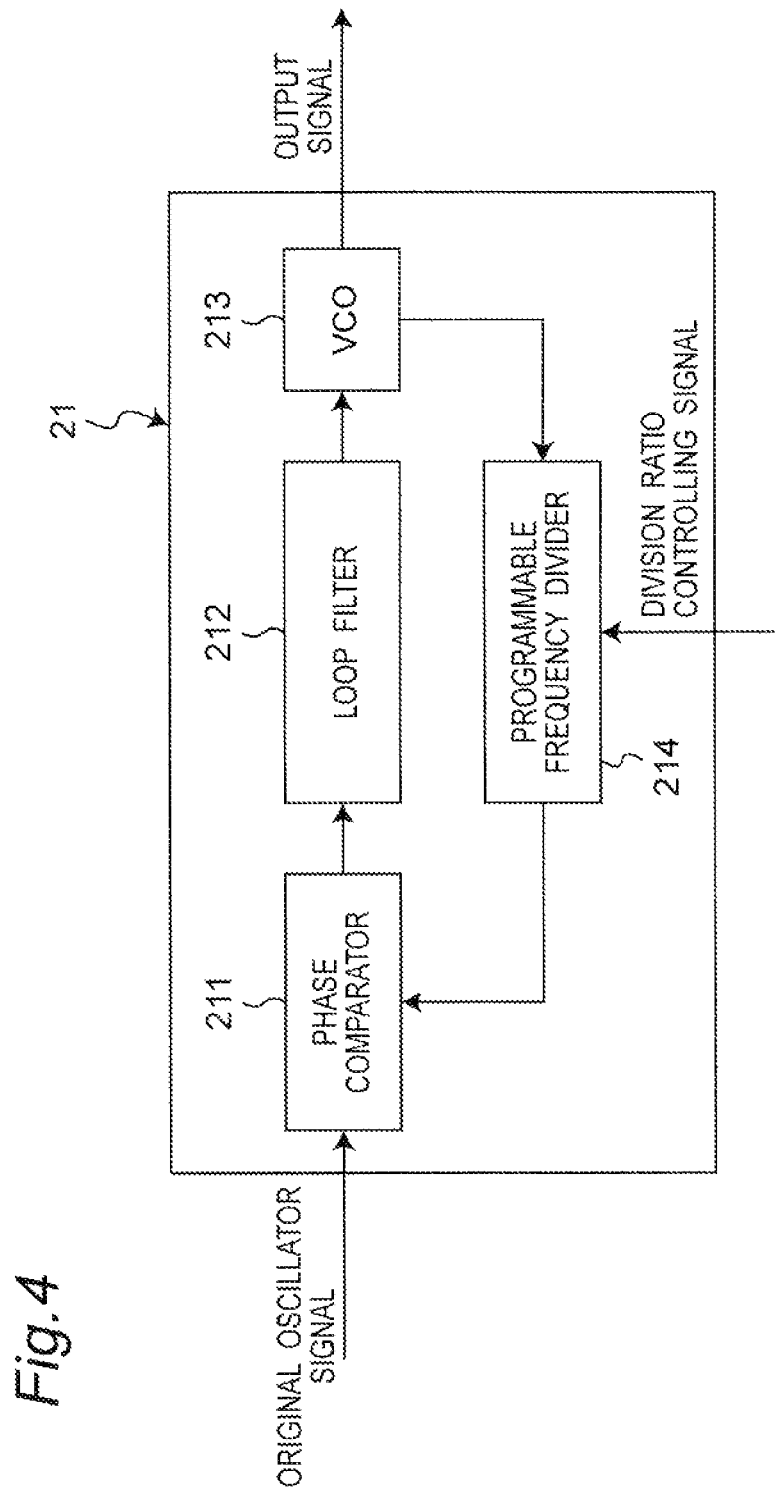
FIG. 4 is a block diagram of frequency synthesizer.

2.2 Operation of Corrector Unit Frequency Correction of Original Oscillator Signal FIG. 4 is a block diagram showing the detail of the frequency synthesizer 21 of the corrector unit 2. The frequency synthesizer 21 is a PLL frequency synthesizer. In the frequency synthesizer 21, a phase comparator 211 thereof firstly detects a phase difference between the original oscillator signal received from the oscillator unit 1 and a feedback signal (PLL feedback signal) that is fed back from a VCO (Voltage Controlled Oscillator) 213 via a programmable frequency divider 214, and outputs the detected phase difference as an error signal to a loop filter 212. The loop filter 212 removes unnecessary short period (high frequency) fluctuation components contained in the error signal, and outputs it as a correction signal to the VCO 213. The VCO 213 controls the frequency of the output signal in accordance with the level (voltage) of the received correction signal, and outputs an output signal of a frequency corresponding to the level of the correction signal.

2.2.1. Control of Division Ratio of Programmable Frequency Divider

The programmable frequency divider 214 is a frequency divider whose division ratio can variably be set according to control exerted from the outside. In the corrector unit 2, the division ratio of the programmable frequency divider 214 is set in accordance with a division ratio control signal output from the division ratio controller unit 22. In the following, a description will be given of an operation of the division ratio controller unit 22, which receives an oscillator feedback signal of the MEMS resonator 13, acquires the gain of the MEMS resonator 13 based on the magnitude of the level (voltage) of the oscillator feedback signal, and controls the division ratio of the programmable frequency divider 214 based on the gain of the MEMS resonator 13.

Figure 5:
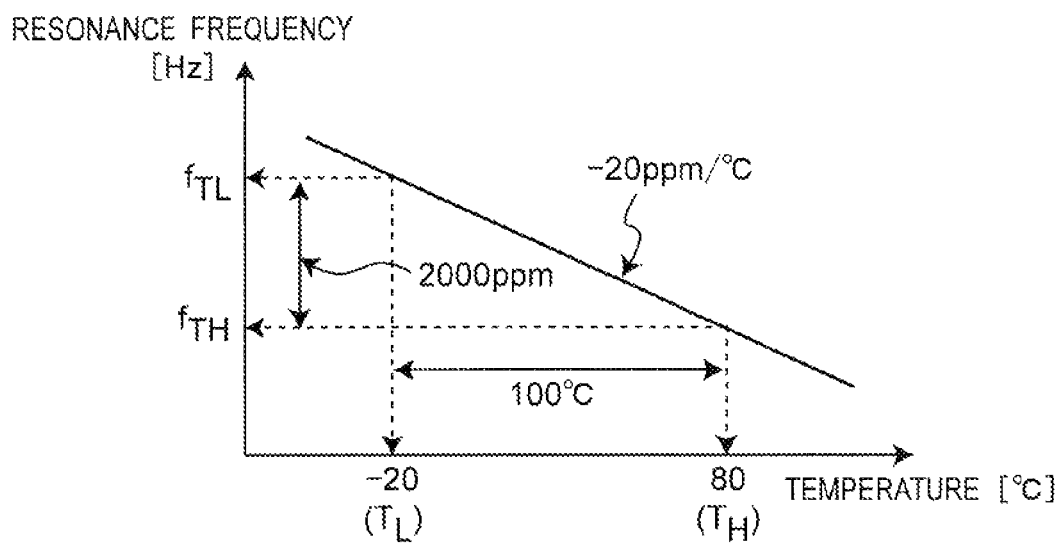
FIG. 5 is a graph of a temperature characteristic of a resonance frequency of the MEMS resonator.

FIG. 5 is a graph showing the temperature characteristic of the resonance frequency of the MEMS resonator 13. The resonance frequency herein corresponds to the peak frequency f in the pass characteristic 401 in FIG. 2. As shown in the drawing, the resonance frequency of the MEMS resonator 13 has the temperature dependence of about −20 [ppm/degree Celsius]. As can clearly be seen from the drawing, the resonance frequency of the MEMS resonator 13 monotonously reduces in accordance with an increase in the temperature. It is to be noted that the MEMS oscillator according to the present embodiment and that according to the following second embodiment are applicable to a case where the resonance frequency of the resonator monotonously increases in accordance with an increase in the temperature.

Figure 6:
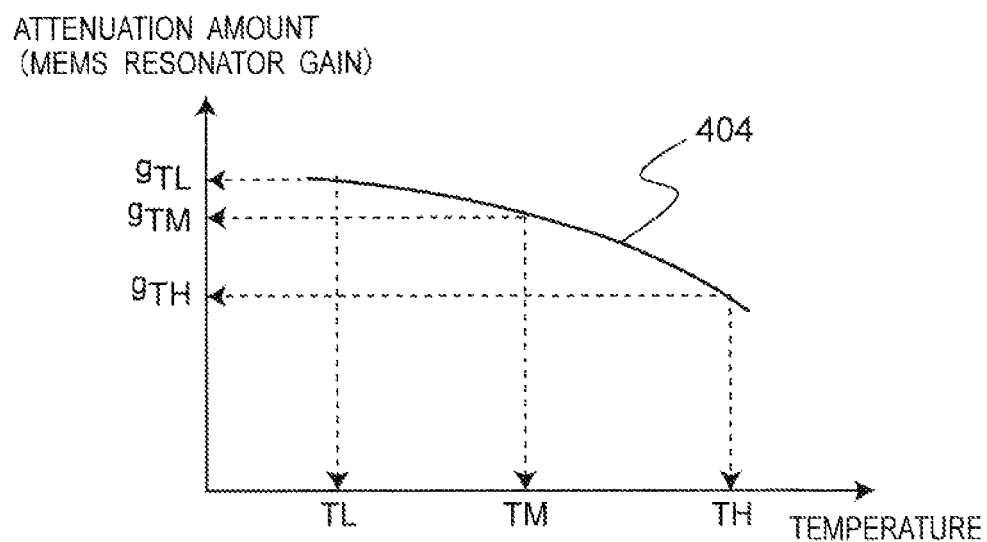
FIG. 6 is a graph of a temperature characteristic of an output of the MEMS resonator.

FIG. 6 is a graph showing the temperature characteristic of the attenuation amount (MEMS resonator gain) of the MEMS resonator 13. As shown in the drawing, the attenuation amount of the MEMS resonator 13 similarly has a temperature characteristic 404 that monotonously reduces in accordance with an increase in its temperature.

Figure 7:
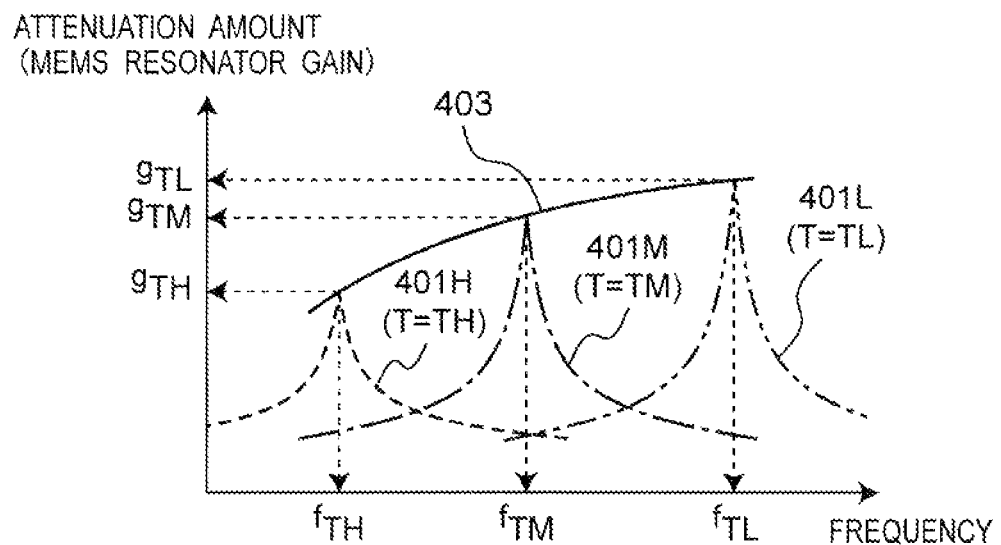
FIG. 7 is a graph of a frequency characteristic of an output of the MEMS resonator.

From FIGS. 5 and 6, the correspondence relationship between the resonance frequency and the gain of the MEMS resonator 13 is derived. FIG. 7 is a graph showing the correspondence relationship between the resonance frequency and the gain of the MEMS resonator 13. In the drawing, a pass characteristic 401H is the pass characteristic of the MEMS resonator 13 where temperature T=TH. For example, it can be seen that, when the MEMS resonator 13 shows the resonance frequency fTH, the corresponding gain of the MEMS resonator 13 is gTH. The same holds true for pass characteristics 401M and L. Here, the temperatures TH, TM and TL satisfy the relationship TH>TM>TL. By connecting the resonance frequencies (fTH, fTM, fTL) at their respective temperatures and the gains of the resonance frequencies at other temperatures which are not shown, a curve 403 is obtained. The curve 403 is a curve that shows the correspondence relationship between the resonance frequency and the gain of the MEMS resonator 13.

Meanwhile, in the oscillator unit 1, by the action of the automatic gain controller 11 thereof, the output level from the amplifier 12 is maintained always constant. Hence, the level of the feedback signal from the MEMS resonator 13 corresponds to the gain of the MEMS resonator 13. Accordingly, the level of the feedback signals from the MEMS resonator 13 shows the temperature characteristic as a curve 601 shown in FIG. 8. For example, the MEMS resonator 13 outputs, when its operating temperature is TL, a feedback signal containing a frequency component of the frequency fTL having a level (voltage) VTL, and the level of the frequency component substantially agrees with the peak voltage of the feedback signal. The same holds true for the other temperatures.

As shown in FIG. 1, the division ratio controller unit 22 receives an oscillator feedback signal (original oscillating frequency information signal) from the MEMS resonator 13; detects the maximum level (peak voltage) of the oscillator feedback signal; and based on the peak voltage and the correspondence relationship between the resonance frequency and the gain shown in FIG. 7, derives the corresponding resonance frequency of the MEMS resonator 13. That is, the oscillator feedback signal (original oscillating frequency information signal) is an information signal containing information on the gain of the MEMS resonator 13. The division ratio controller unit 22 derives a resonance frequency from the information signal. Then, from the derived resonance frequency and the previously set frequency of an output signal, the division ratio controller unit 22 determines a division ratio to be set to the programmable frequency divider 214, and outputs to the programmable frequency divider 214 a division ratio controlling signal for setting the division ratio of the programmable frequency divider 214 to the determined division ratio.

Figure 9:
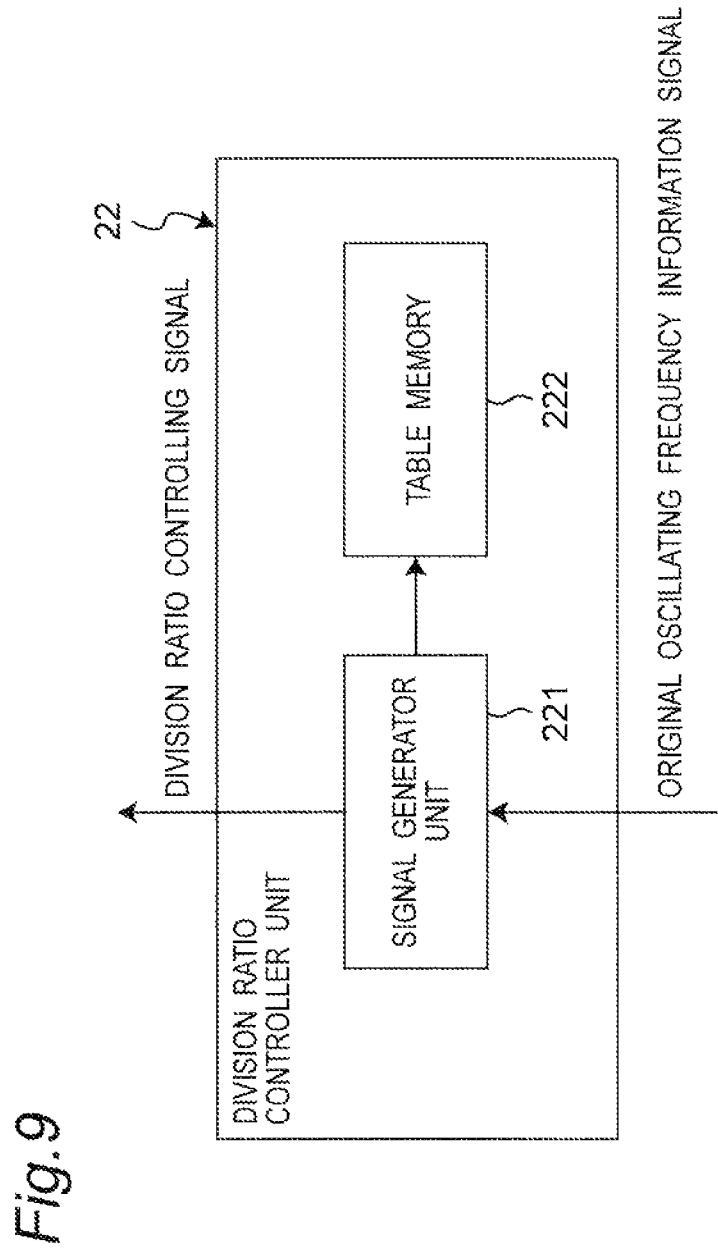
FIG. 9 is a block diagram of a division ratio controller unit.

FIG. 9 is a block diagram showing an example of the division ratio controller unit 22. A signal generator unit 221 receives an original oscillating frequency information signal (oscillator feedback signal); detects the peak voltage thereof; refers to a table memory 222 that stores therein a table that represents association between the peak voltage and the division ratio of the programmable frequency divider 214; and determines a division ratio to be set to the programmable frequency divider 214. It is to be noted that, the division ratio controller unit 22 may include a peak hold circuit for detecting the peak voltage of the original oscillating frequency information signal.

Figure 10:
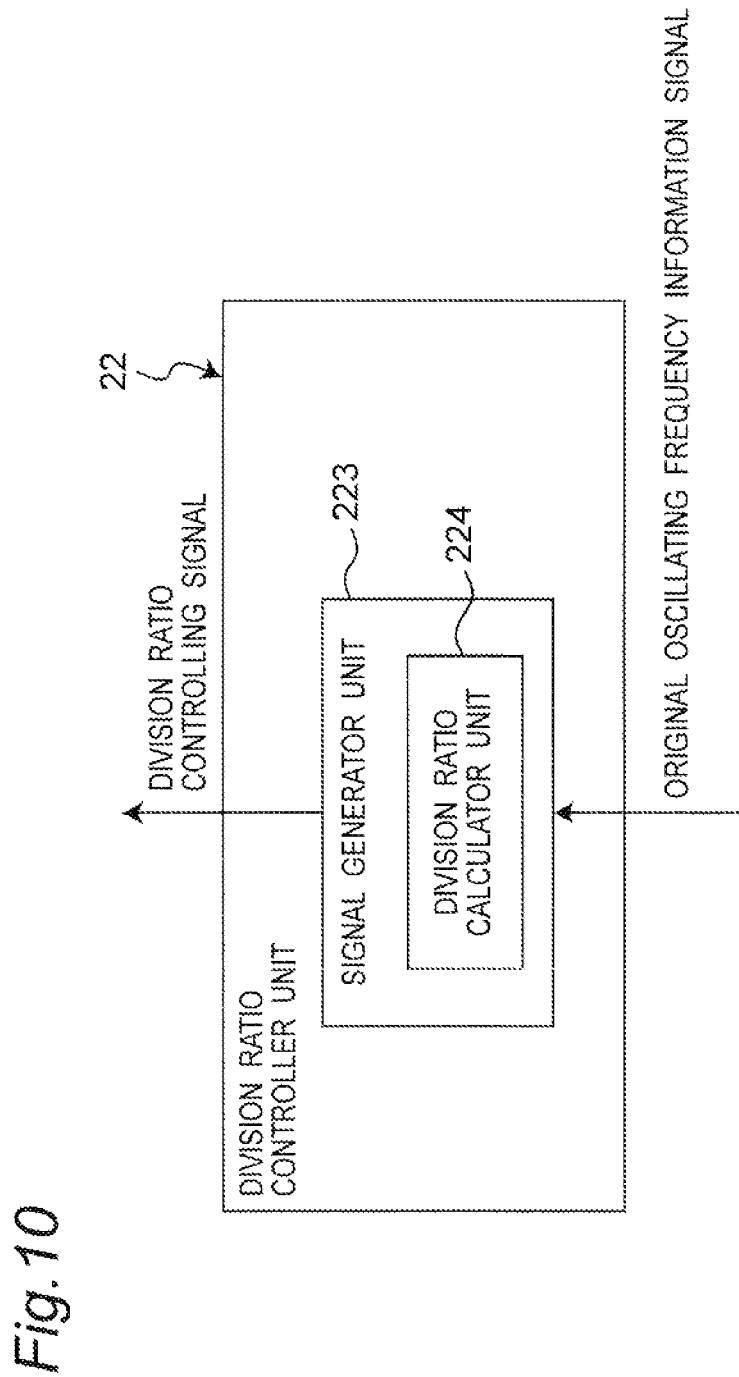
FIG. 10 is a block diagram of another example of a division ratio controller unit.

FIG. 10 is a block diagram showing another example of the division ratio controller unit 22. The signal generator unit 221 receives an original oscillating frequency information signal (oscillator feedback signal), and detects the peak voltage thereof. Then, a division ratio calculator unit 224 inputs the detected peak voltage into a function that approximates the correspondence relationship between the resonance frequency and the gain of the MEMS resonator 13 shown in FIG. 7; calculates the corresponding resonance frequency of the MEMS resonator 13; and calculates a division ratio to be set to the programmable frequency divider 214 from the preset output signal frequency and the calculated resonance frequency of the MEMS resonator 13. Then, the signal generator unit 223 outputs the calculated division ratio as a division ratio controlling signal to the programmable frequency divider 214.

3. Summary of First Embodiment

In this manner, the MEMS oscillator 100 according to the present embodiment is capable of correcting the frequency of an original oscillator signal that fluctuates due to fluctuations in the temperature or the like, based on the correspondence relationship between the gain and the resonance frequency of the MEMS resonator 13, to output an output signal having a preset frequency. The MEMS oscillator 100 according to the present embodiment is capable of acquiring the gain of the MEMS resonator 13 in real time using the signal issued by the MEMS resonator 13 itself, to correct the frequency of the original oscillator signal. That is, the gain of the MEMS resonator 13 (oscillator feedback signal level) can be used as the information on the operating temperature of the MEMS resonator 13. Accordingly, in the MEMS oscillator 100, the operating temperature is obtained from the gain of the MEMS resonator 13; the corresponding resonance frequency of the MEMS resonator 13 is obtained from the temperature characteristic from the resonance frequency; and the operation of the frequency synthesizer 21 is controlled, to output an output signal having a desired frequency.

Therefore, the MEMS oscillator 100 does not require a temperature sensor which is required in the conventional structure. Hence, in the MEMS oscillator 100, there is no deviation from the frequency set value for the output signal due to deviation of the actual operating temperature of the vibrator from the measured temperature of the temperature sensor. Hence, the MEMS oscillator 100 is capable of always outputting output signals of high quality stably.

Figure 11:
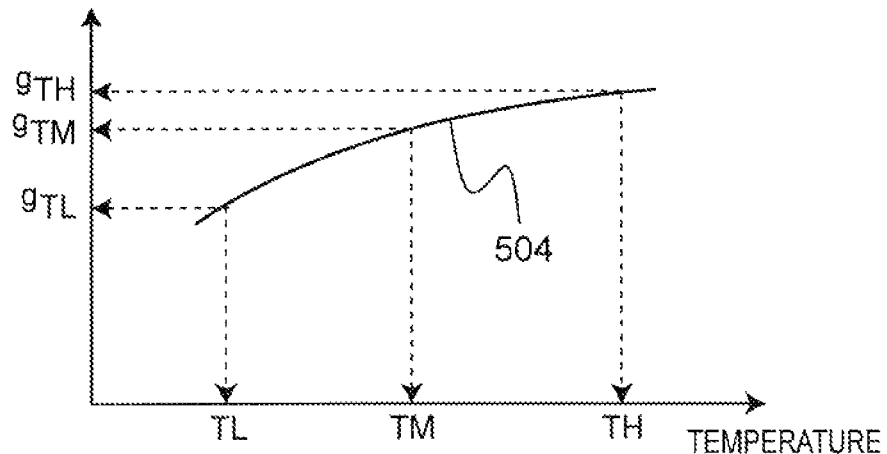
FIG. 11 is a graph of a temperature characteristic of an output of the MEMS resonator.
Figure 12:
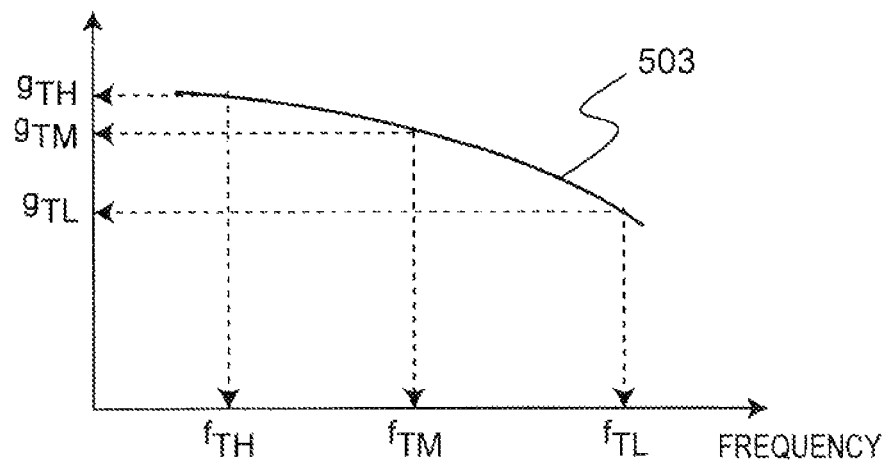
FIG. 12 is a graph of a frequency characteristic of an output of the MEMS resonator.
Figure 13:
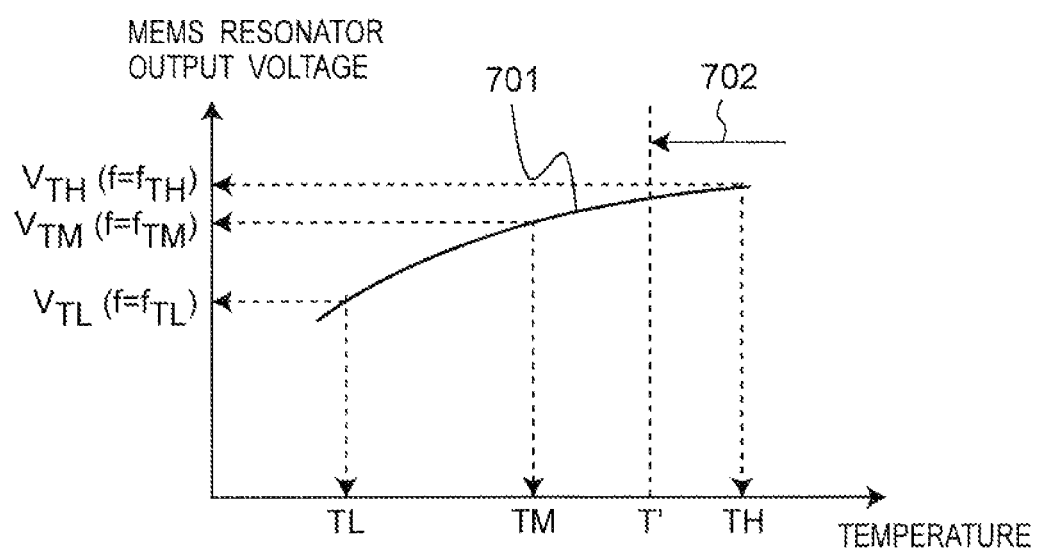
FIG. 13 is a graph of a temperature characteristic of an output voltage of the MEMS resonator.

It is to be noted that, with the MEMS resonator 13 that has a temperature characteristic 504 of the gain shown in FIG. 11 also, the MEMS oscillator 100 according to the present embodiment can be structured. In this case, the correspondence relationship between the resonance frequency and the gain of the MEMS resonator 13 draws a curve that monotonously reduces in accordance with an increase in the temperature like the curve 503 shown in FIG. 12. Hence, the level of the oscillator feedback signal from the MEMS resonator 13 changes like the curve 701 shown in FIG. 13 in accordance with a change in the temperature.

It is to be noted that, in the present embodiment, the structure of the PLL frequency synthesizer using an analog PLL circuit as the frequency synthesizer 21 has been shown. However, the frequency synthesizer 21 is not limited to an analog PLL circuit, and it may be structured by using a digital PLL circuit or an all digital PLL circuit. Further, the frequency synthesizer 21 may be of a circuit structure other than a PLL circuit.

Further, the programmable frequency divider 214 of the PLL frequency synthesizer 21 according to the present embodiment may be structured by using any of an integer type frequency divider and a fractional type frequency divider.

Second Embodiment

Figure 14:
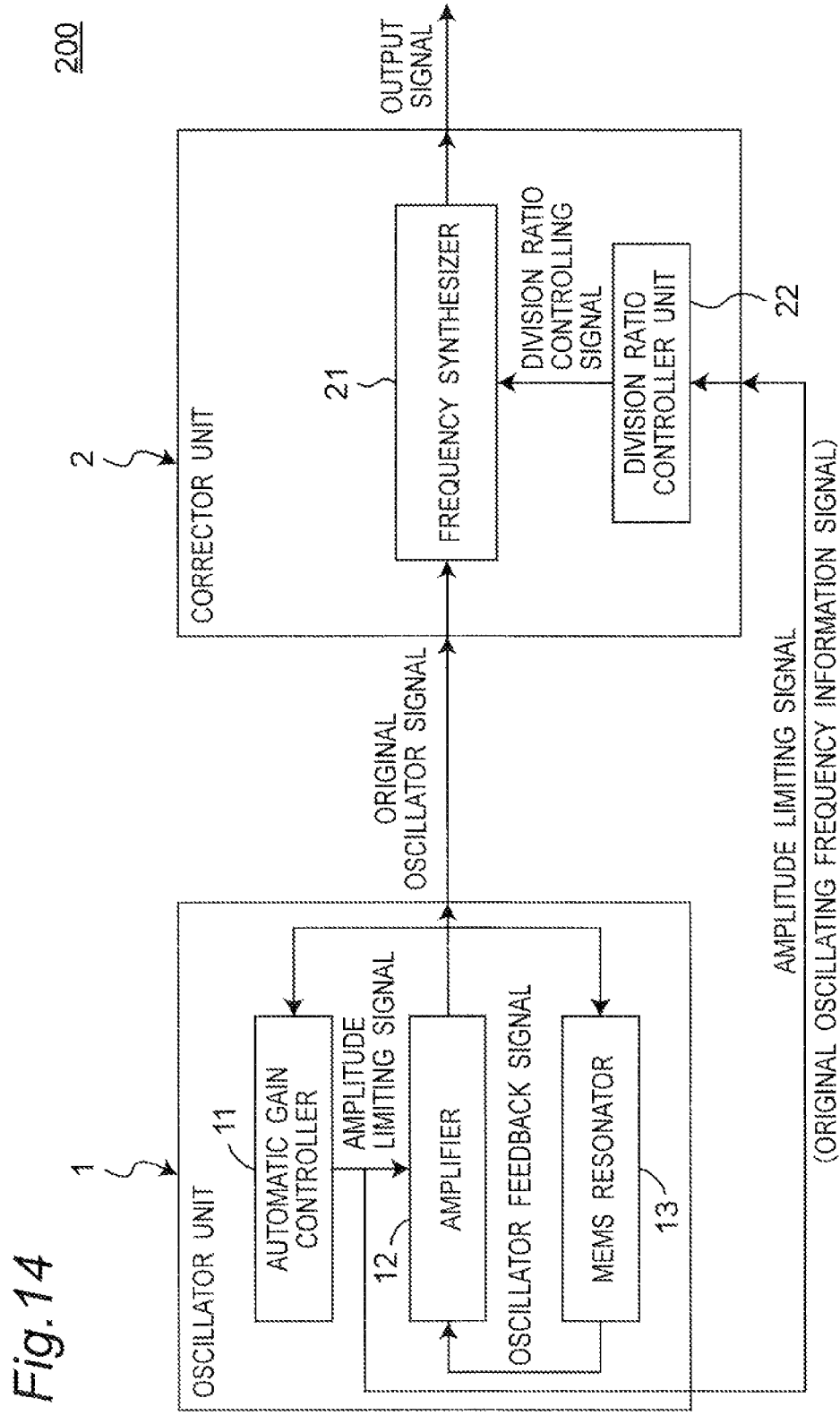
FIG. 14 is a block diagram of a MEMS oscillator of a second embodiment.

FIG. 14 is a block diagram of a MEMS oscillator according to a second embodiment. The constituents equivalent to those of the MEMS oscillator 100 according to the first embodiment are denoted by the similar reference numerals, and a description thereof is omitted as appropriate.

A MEMS oscillator 200 according to the second embodiment uses, as an original oscillating frequency information signal, an amplitude limiting signal that the automatic gain controller 11 outputs. As has been described above, the amplitude limiting signal is a signal that is used to control the amplifier 12 to maintain the gain constant.

Figure 15:
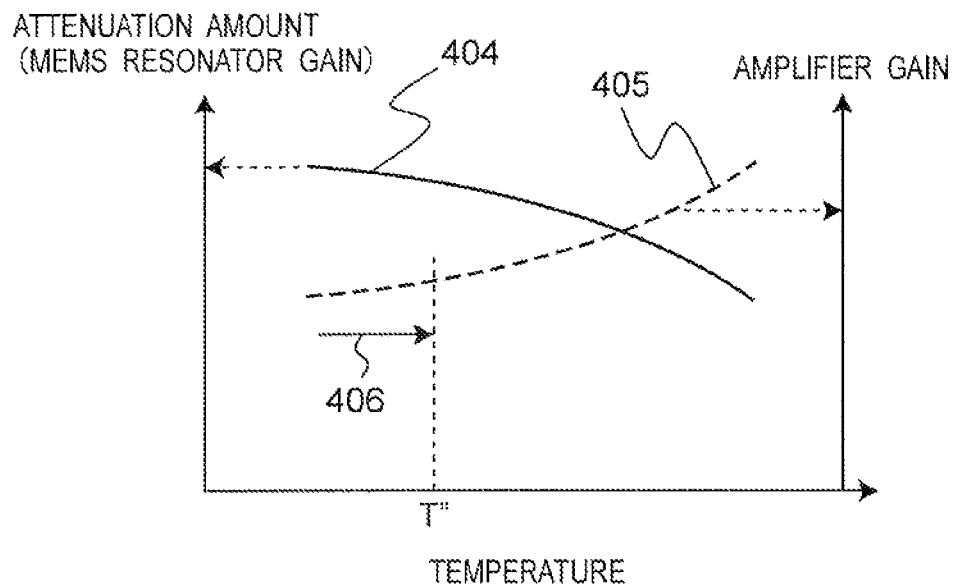
FIG. 15 is a graph showing the relationship between an output of the MEMS resonator and an output of an amplifier.

FIG. 15 is a graph that shows the relationship between a gain 404 of the MEMS resonator 13 and a gain 405 of the amplifier 12 in accordance with the operating temperature of the MEMS resonator 13. As can be seen, the gain 405 of the amplifier 12 and the gain 404 of the MEMS resonator 13 have one-to-one correspondence relationship. That is, the amplitude limiting signal (original oscillating frequency information signal) is an information signal including a signal having a correspondence relationship between the gain at the resonance frequency of the MEMS resonator 13. Accordingly, by monitoring the amplitude limiting signal which is a signal for controlling the gain of the amplifier 12, the gain of the MEMS resonator 13 can be acquired. The division ratio controller unit 22 receives the amplitude limiting signal as the original oscillating frequency information signal; detects the gain of the MEMS resonator 13 based on that signal; and derives the corresponding resonance frequency of the MEMS resonator 13 based on the correspondence relationship between the resonance frequency and the gain of the MEMS resonator 13 as shown in FIG. 7. Then, in a similar manner as in the first embodiment, the division ratio controller unit 22 determines the division ratio to be set to the programmable frequency divider 214.

Figure 16:
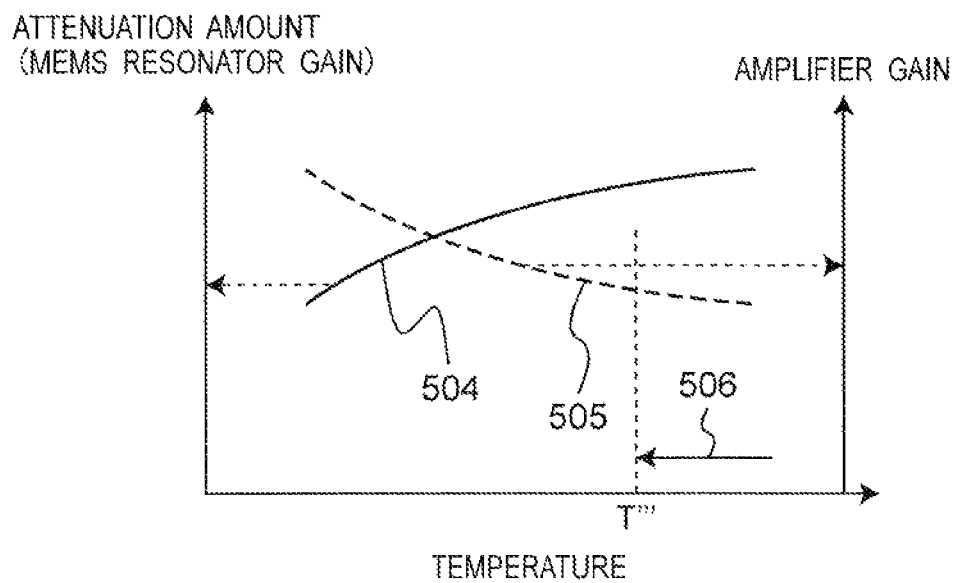
FIG. 16 is a graph showing the relationship between an output of the MEMS resonator and an output of the amplifier.

It is to be noted that, with the MEMS resonator 13 that has a temperature characteristic 504 of the gain shown in FIG. 16 also, the MEMS oscillator 200 of the present embodiment can be structured. In this case, the correspondence relationship between the gain of the MEMS resonator 13 and the gain of the amplifier 12 draws a curve that monotonously reduces in accordance with an increase in the temperature like a curve 505 shown in FIG. 16.

First Variation of Corrector Unit

Figure 17:
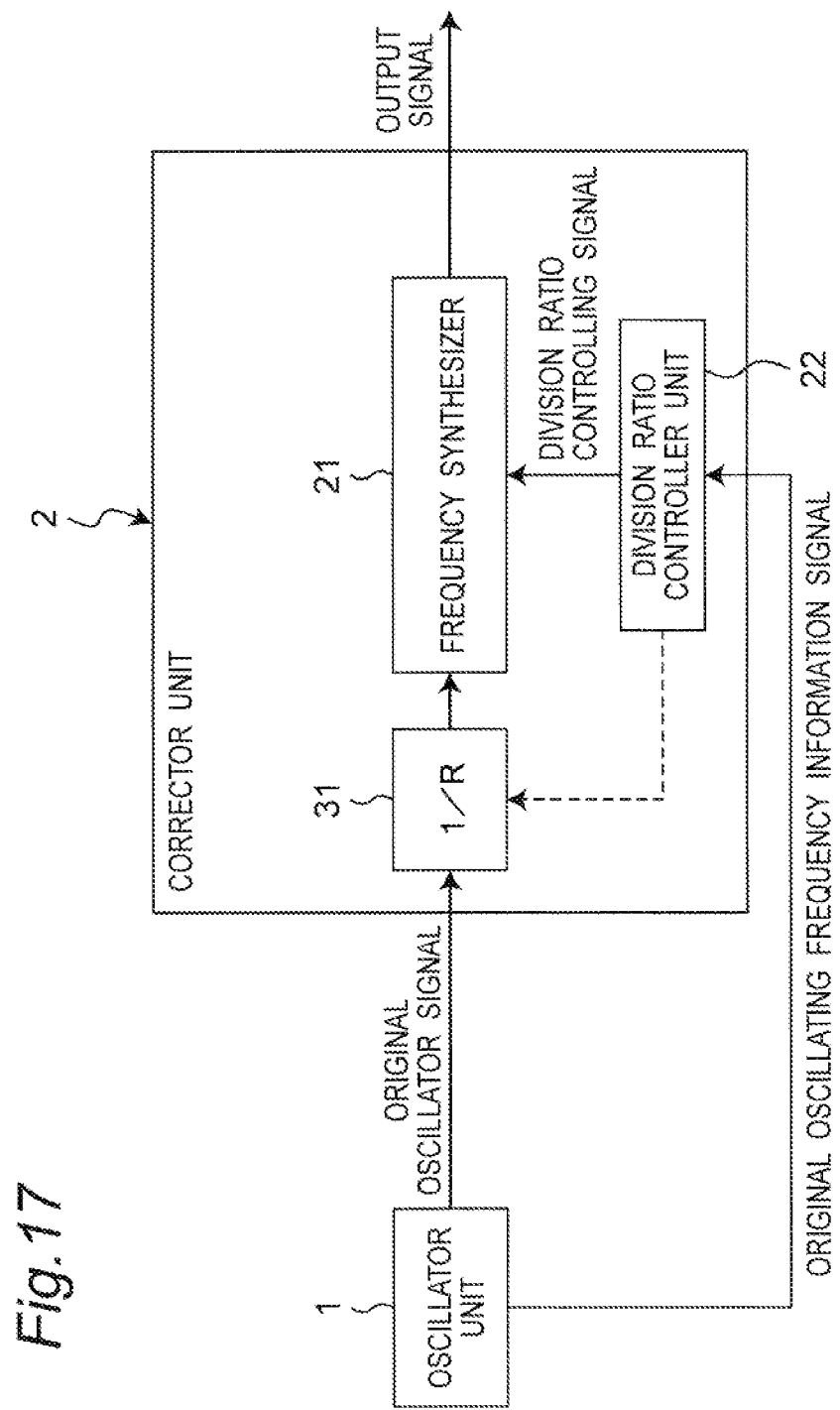
FIG. 17 is a block diagram of a variation of a corrector unit.

FIG. 17 is a diagram showing a first variation of the corrector unit 2 that is applicable to the MEMS oscillators 100 and 200. In the present variation, at the front stage relative to the PLL frequency synthesizer 21, a frequency divider 31 that divides the frequency of an original oscillator signal into 1/R is disposed. In this manner, by dividing the frequency of the original oscillator signal by using the frequency divider 31 and by entering the original oscillator signal having its frequency divided into the PLL frequency synthesizer 21, even when the frequency of the original oscillator signal and the frequency of the output signal are on the order of the similar level, it becomes possible to finely correct the frequency of the original oscillator signal. Further, as shown by a broken line in FIG. 17, it is also possible to structure the frequency divider 31 with the second programmable frequency divider, and to structure the division ratio controller unit 22 to control the division ratio of the frequency divider 31. In this case, the corrector unit 2 is capable of finely correcting the frequency of the original oscillator signal to a frequency of any scalar multiplication, under control of the division ratio controller unit 22.

Second Variation of Corrector Unit

Figure 18:
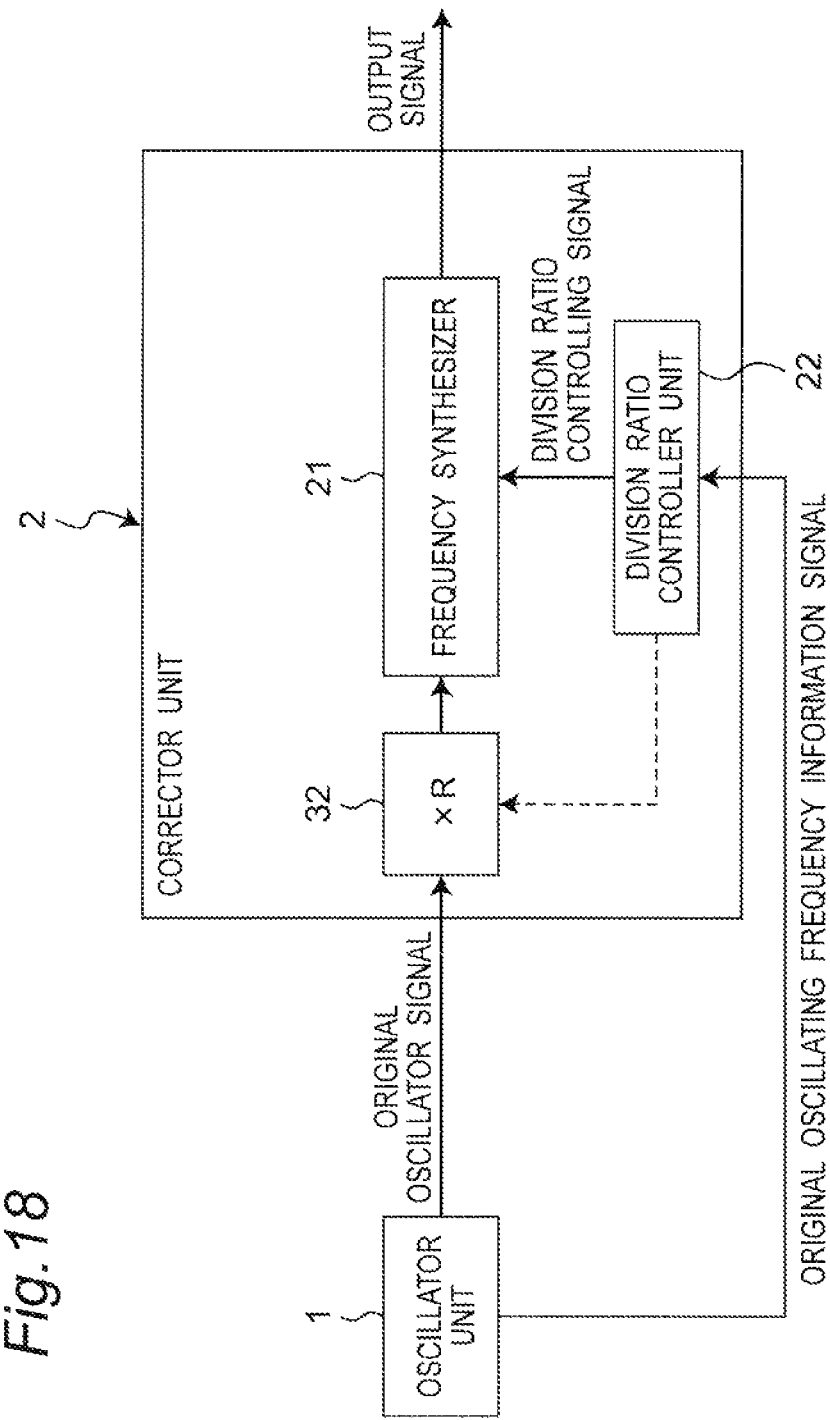
FIG. 18 is a block diagram of a variation of a corrector unit.

FIG. 18 is a diagram showing a second variation of the corrector unit 2 that can be applied to the MEMS oscillators 100 and 200. In the present variation, at the front stage relative to the PLL frequency synthesizer 21, a multiplier 32 that multiplies the frequency of an original oscillator signal by R is disposed. In this manner, by multiplying the frequency of the original oscillator signal by using the multiplier 32 and by entering the original oscillator signal having its frequency multiplied into the PLL frequency synthesizer 21, even when the frequency of the output signal is small enough as compared to the frequency of the original oscillator signal, it becomes possible to finely correct the frequency of the original oscillator signal. Further, similarly to the first variation, as shown by the broken line, it is also possible to structure the multiplier 32 with a programmable multiplier, and to structure the division ratio controller unit 22 to control the multiplication ratio of the multiplier 32. In this case also, the corrector unit 2 can finely correct the frequency of the original oscillator signal to a frequency of any scalar multiplication, under control of the division ratio controller unit 22.

It is to be noted that, the corrector unit 2 may further include a frequency divider or a multiplier at the rear stage (where the output of the VCO 213 is received) relative to the PLL frequency synthesizer 21.

Variation of MEMS Oscillator According to First Embodiment

Figure 19:
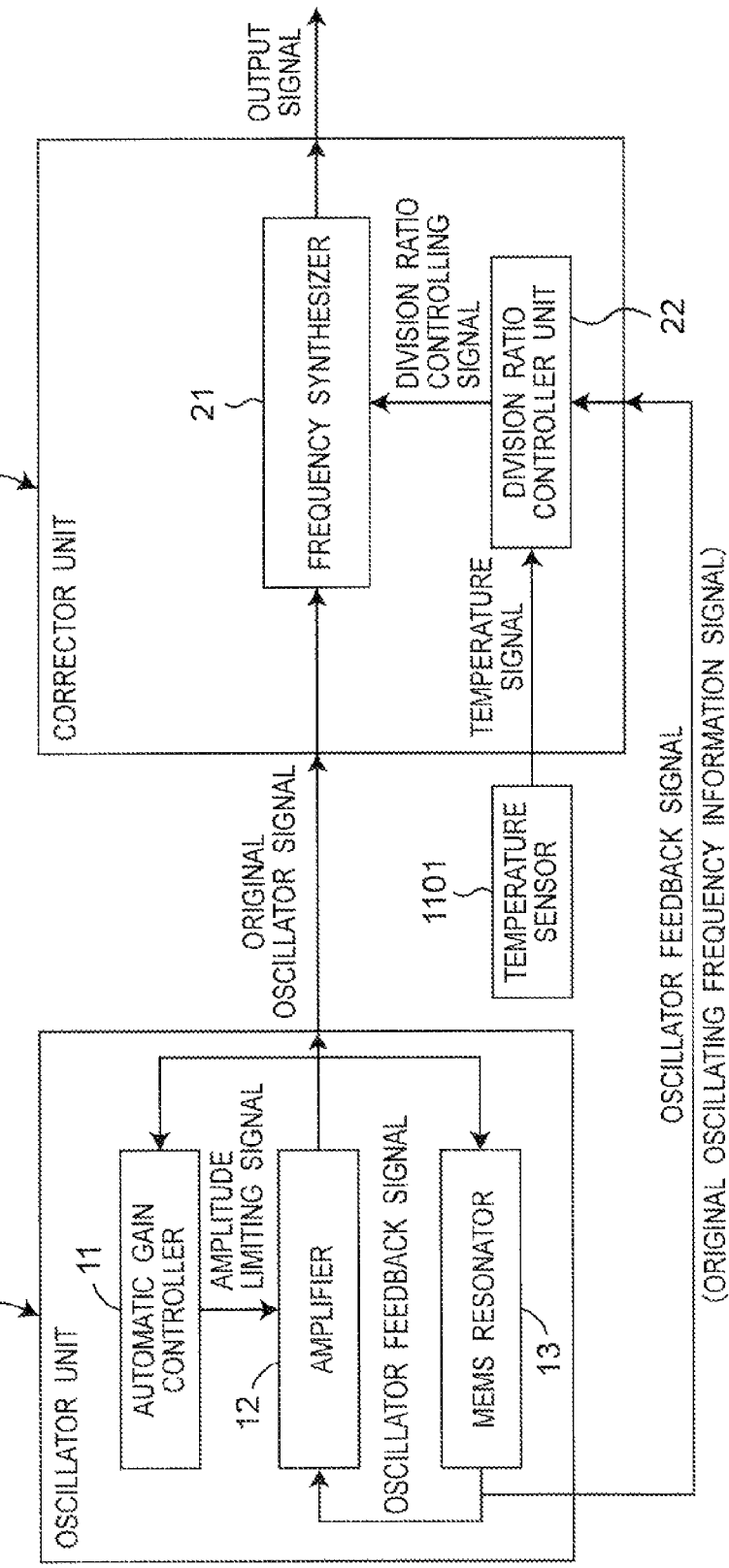
FIG. 19 is a block diagram of a variation of the MEMS oscillator according to the first embodiment.

FIG. 19 is a diagram showing a variation of the MEMS oscillator 100 according to the first embodiment. A MEMS oscillator variation 1100 includes, in addition to the structure of the MEMS oscillator 100, a temperature sensor 1101. The output of the temperature sensor 1101 is received by the division ratio controller unit 22.

Figure 8:
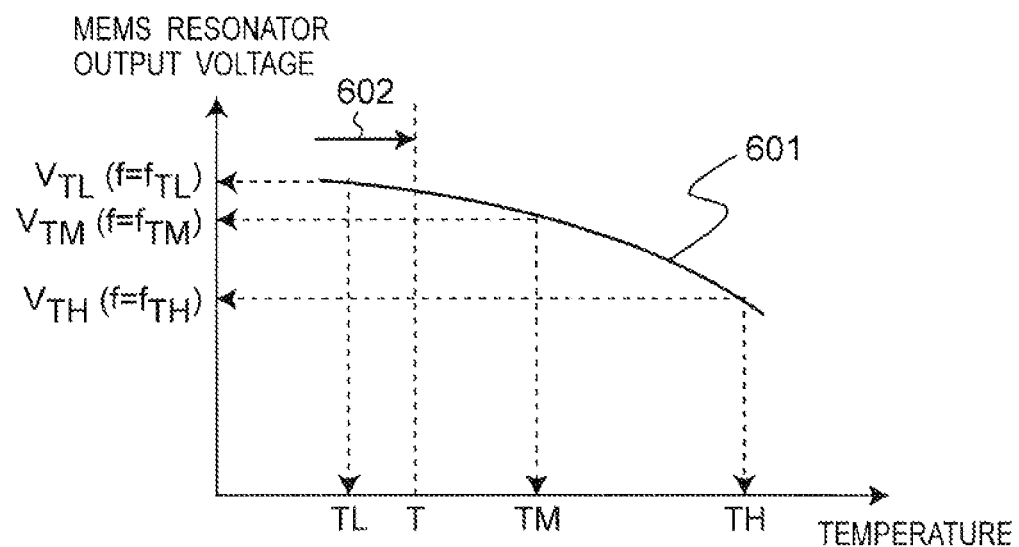
FIG. 8 is a graph of a temperature characteristic of the output voltage of the MEMS resonator.

As shown in FIG. 8, in a temperature range 602 including temperatures equal to or lower than a prescribed temperature T, a change in the output level of the MEMS resonator 13 due to a change in the temperature is small as compared to the other temperature ranges. Accordingly, at a temperature equal to or lower than the prescribed temperature T, the division ratio controller unit 22 may use the output of the temperature sensor 1101 to generate a division ratio controlling signal. In this manner, the MEMS oscillator 1100 is capable of stably outputting output signals of high quality even in a temperature range where the fluctuation in the output level of the MEMS resonator 13 due to a change in the temperature is relatively small.

It is to be noted that, when the output level of the MEMS resonator 13 monotonously increases in accordance with an increase in the temperature (such as a characteristic 701 shown in FIG. 13), in a temperature range 702 including temperatures equal to or higher than a prescribed temperature T', a change in the output level of the MEMS resonator 13 due to a change in the temperature is small as compared to the other temperature ranges. Accordingly, at a temperature equal to or higher than the prescribed temperature T', the division ratio controller unit 22 may use the output of the temperature sensor 1101 to generate a division ratio controlling signal.

Variation of MEMS Oscillator According to Second Embodiment

Figure 20:
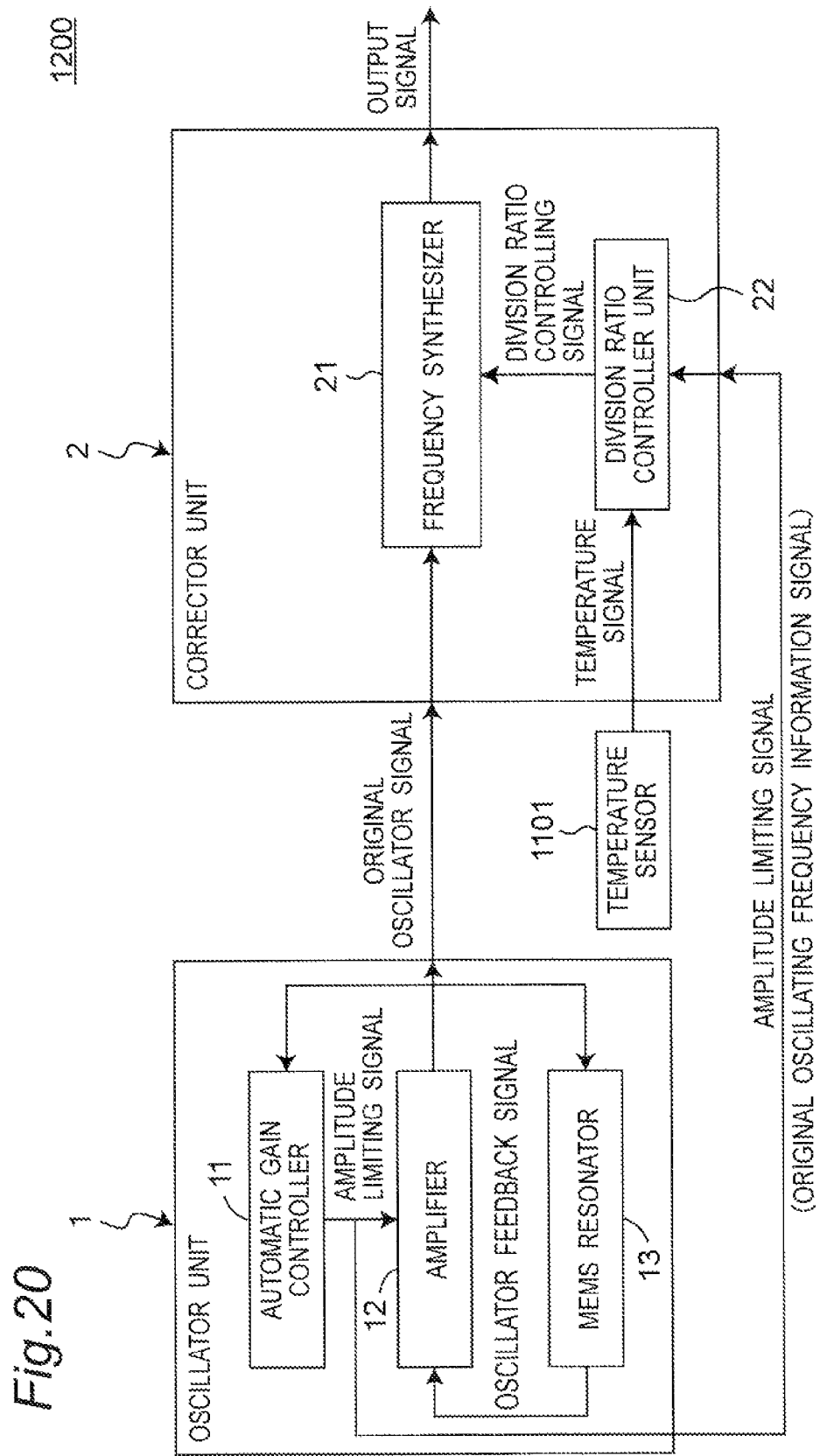
FIG. 20 is a block diagram of a variation of the MEMS oscillator according to the second embodiment.
Figure 21:
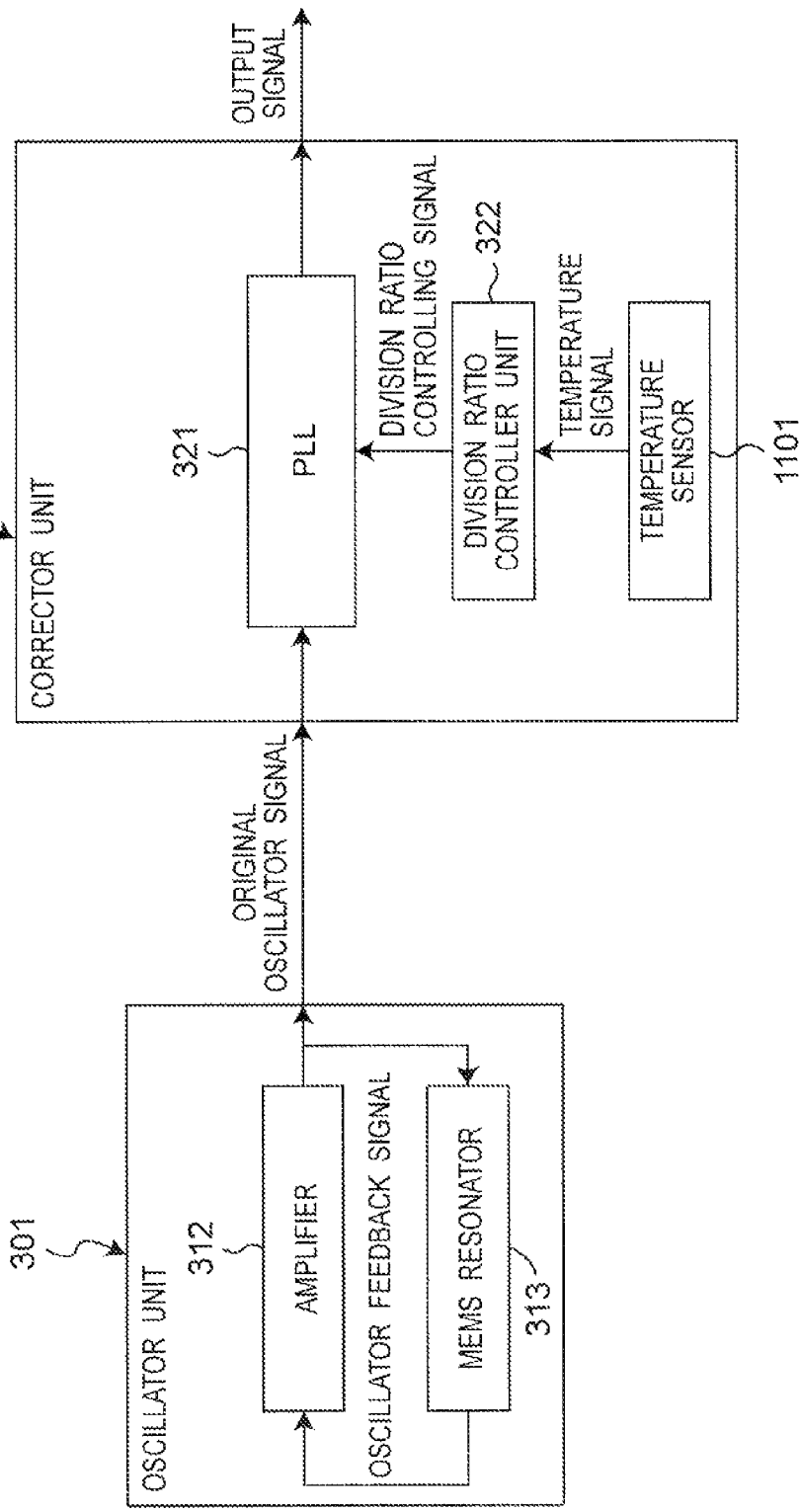
FIG. 21 is a block diagram of a conventional MEMS oscillator.
Figure 22:
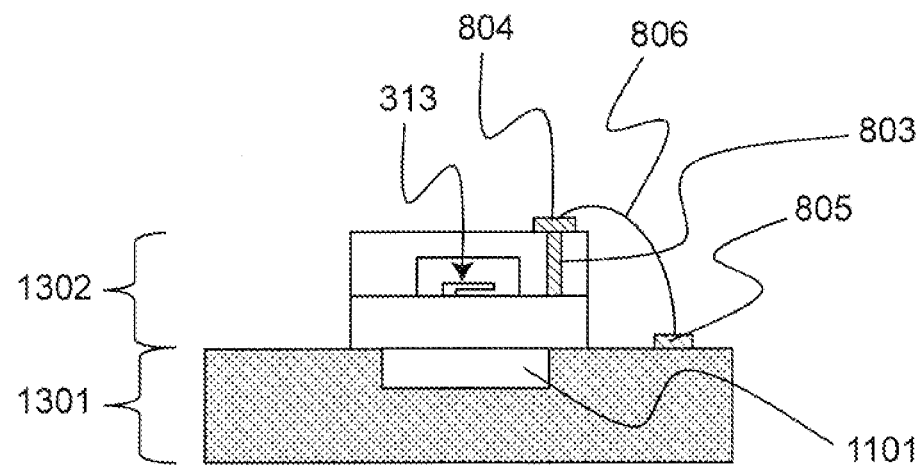
FIG. 22 is a side cross-sectional view of a conventional MEMS oscillator.
Figure 23:
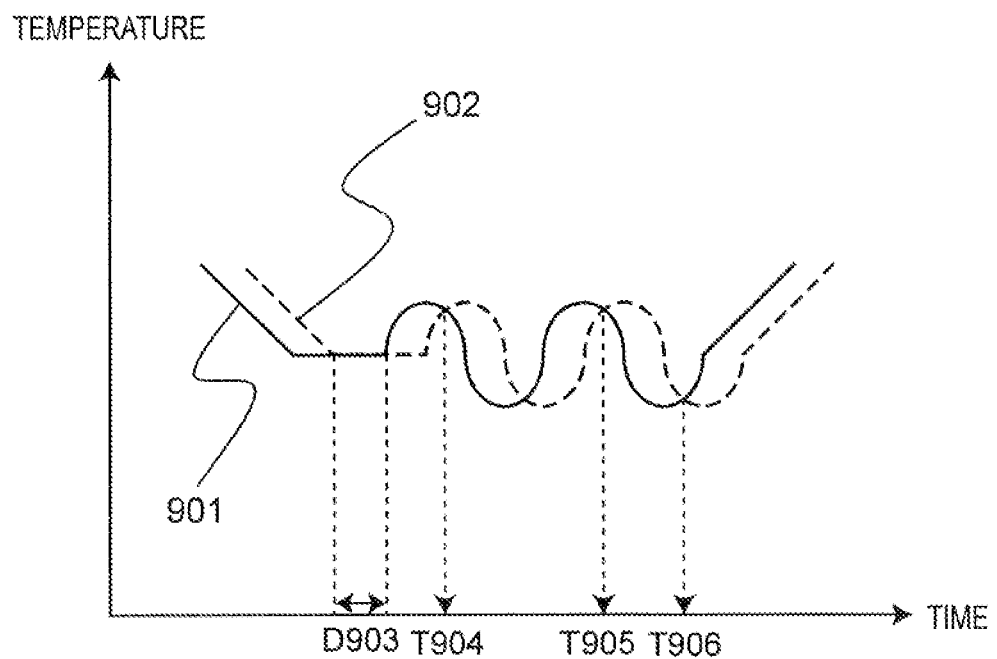
FIG. 23 is a graph showing the relationship between the temperature fluctuation measured by a temperature sensor and the actual temperature fluctuation of a vibrator.

FIG. 20 is a diagram showing a variation of the MEMS oscillator 200 according to the second embodiment. A MEMS oscillator variation 1200 includes, in addition to the structure of the MEMS oscillator 200, a temperature sensor 1101. The output of the temperature sensor 1101 is received by the division ratio controller unit 22.

As shown in FIG. 15, in a temperature range 406 including temperatures equal to or lower than a prescribed temperature T'', a change in the gain of the amplifier 12 due to a change in the temperature is small as compared to the other temperature ranges. Accordingly, at a temperature equal to or lower than the prescribed temperature T'', the division ratio controller unit 22 may use the output of the temperature sensor 1101 to generate a division ratio controlling signal. In this manner, the MEMS oscillator 1100 is capable of stably outputting output signals of high quality even in a temperature range where the fluctuation in the gain of the amplifier 12 due to a change in the temperature is relatively small.

It is to be noted that, when the gain of the amplifier 12 monotonously reduces in accordance with an increase in the temperature (such as a characteristic 505 shown in FIG. 16), in a temperature range 506 including temperatures equal to or higher than a prescribed temperature T''', a change in the gain of the amplifier 12 due to a change in the temperature is small as compared to the other temperature ranges. Accordingly, at a temperature equal to or higher than the prescribed temperature T''', the division ratio controller unit 22 may use the output of the temperature sensor 1101 to generate a division ratio controlling signal.

SUMMARY

The MEMS oscillator according to the present embodiment includes: an oscillator unit provided with a feedback type oscillator circuit structured with a MEMS resonator, an amplifier, and an automatic gain controller that controls the gain of the amplifier to maintain the output from the amplifier constant; and a corrector unit that generates and outputs an output signal of a desired frequency from an original oscillator signal output from the oscillator unit.

The corrector unit includes a frequency synthesizer, and a division ratio controller unit that controls the division ratio of the programmable frequency divider disposed at the feedback of the frequency synthesizer based on the gain of the MEMS resonator. The division ratio controller unit determines the division ratio of the programmable frequency divider based on the magnitude of the gain of the MEMS resonator. The magnitude of the gain of the MEMS resonator has temperature dependence similarly to the resonance frequency thereof, and changes monotonously in accordance with a change in the temperature. Hence, the resonance frequency and the magnitude of the gain of the MEMS resonator satisfy one-to-one correspondence relationship, based on which they can uniquely be obtained from each other. Therefore, based on the magnitude of the gain of the MEMS resonator, the corresponding resonance frequency can be obtained. Based on the correspondence relationship, the division ratio controller unit controls the division ratio of the programmable frequency divider in real time, in response to the temporal fluctuation in the gain of the MEMS resonator. In this manner, the temporal fluctuation in the frequency of the original oscillator signal is accurately corrected in real time, and the MEMS oscillator always outputs an output signal of a frequency that agrees with a desired frequency.

It is to be noted that, the division ratio controller unit is capable of receiving a signal that is fed back from the MEMS resonator to the amplifier, and acquiring the gain of the MEMS resonator from the level of the signal. This is explained as follows: in the oscillator unit, the output of the amplifier is always maintained constant by the action of the automatic gain controller and, therefore, the level (voltage) of the feedback signal of the MEMS resonator corresponds excellently to the gain of the MEMS resonator.

Further, the division ratio controller unit is capable of acquiring the gain of the MEMS resonator by monitoring a control signal (amplitude limiting signal) that is for controlling the gain of the amplifier to maintain the output level of the amplifier constant and that is output from the automatic gain controller. This is explained as follows: in the oscillator unit, the automatic gain controller outputs an amplitude controlling signal to maintain the amplifier constant and, therefore, the level of the signal fed back from the MEMS resonator to the amplifier (that is, the gain of the MEMS resonator) can be obtained from the amplitude controlling signal.

The MEMS oscillators of the first and second embodiments are capable of excellently correcting the fluctuations in the frequency of the original oscillator signal due to the temperature dependence of the resonance frequency of the MEMS resonator, and always outputting output signals of a desired frequency stably.

INDUSTRIAL APPLICABILITY

Since the output signals output from the MEMS oscillator according to each of the present embodiments have an always constant frequency, the embodiments are useful for, e.g., clock generators.

REFERENCE SIGNS LIST

1: oscillator unit
2: corrector unit
11: automatic gain controller
12: amplifier
13: MEMS resonator
21: frequency synthesizer
22: division ratio controller unit
111: peak hold circuit
112: reference voltage input terminal
113: comparator
211: phase comparator
212: loop filter
213: voltage controlled oscillator
214: programmable frequency divider
221: signal generator unit
222: table memory
223: signal generator unit
224: division ratio calculator unit

The invention claimed is:

1. A MEMS oscillator, comprising:
an oscillator unit being capable of outputting an output from an amplifier as an original oscillator signal that includes a feedback type oscillator circuit having a MEMS resonator and the amplifier, and an automatic gain controller receiving the output from the amplifier and controlling a gain of the amplifier based on a level of the output to maintain a level of the output from the amplifier constant; and
a corrector unit that receives the original oscillator signal and generates from the original oscillator signal a signal of a predetermined set frequency to output the generated signal of the predetermined set frequency as an output signal,
wherein the corrector unit receives, separately from the original oscillator signal, an information signal that includes a signal containing information on a gain at a resonance frequency of the MEMS resonator from the oscillator unit, corrects a frequency of the original oscillator signal based on the information signal to generate the signal of the predetermined set frequency, and outputs the generated signal of the predetermined set frequency as the output signal, and
wherein the information signal is a feedback signal from the MEMS resonator to the amplifier.

2. The MEMS oscillator according to claim 1, wherein the corrector unit includes a frequency synthesizer having a programmable frequency divider that can variably control a division ratio, and a division ratio controller unit that controls the division ratio of the programmable frequency divider, and
wherein the division ratio controller unit controls the division ratio of the programmable frequency divider based on the information signal, and
wherein the frequency synthesizer receives the original oscillator signal to generate the signal of the predetermined set frequency from the original oscillator signal and outputs the generated signal of the predetermined set frequency as the output signal.

3. The MEMS oscillator according to claim 1,
wherein the automatic gain controller includes a peak hold circuit that receives the original oscillator signal and that detects a peak voltage of the original oscillator signal, and a comparator that compares the detected peak voltage and a prescribed reference voltage against each other and that outputs a signal indicative of a result of the comparison, and
wherein the automatic gain controller outputs the signal indicative of the result of the comparison as the control signal, to control the gain of the amplifier.

4. The MEMS oscillator according to claim 2,
wherein the corrector unit further includes a second frequency divider that receives the original oscillator signal, that divides a frequency of the original oscillator signal, and that outputs the original oscillator signal of the divided frequency to the frequency synthesizer.

5. The MEMS oscillator according to claim 4,
wherein the second frequency divider is a second programmable frequency divider, and
wherein the division ratio controller unit controls a division ratio of the second programmable frequency divider, based on the information signal.

6. The MEMS oscillator according to claim 2,
wherein the corrector unit further includes a multiplier that receives the original oscillator signal, that multiplies the original oscillator signal, and that outputs the multiplied original oscillator signal to the frequency synthesizer.

7. The MEMS oscillator according to claim 6,
wherein the multiplier is a programmable multiplier, and
wherein the division ratio controller unit controls a multiplication ratio of the programmable multiplier, based on the information signal.

8. A MEMS oscillator, comprising:
an oscillator unit being capable of outputting an output from an amplifier as an original oscillator signal that includes a feedback type oscillator circuit having a MEMS resonator and the amplifier, and an automatic gain controller receiving the output from the amplifier and controlling a gain of the amplifier based on a level of the output to maintain a level of the output from the amplifier constant; and
a corrector unit that receives the original oscillator signal and generates from the original oscillator signal a signal of a predetermined set frequency to output the generated signal of the predetermined set frequency as an output signal, wherein the corrector unit receives, separately from the original oscillator signal, an information signal that includes a signal containing information on a gain at a resonance frequency of the MEMS resonator from the oscillator unit, corrects a frequency of the original oscillator signal based on the information signal to generate the signal of the predetermined set frequency, and outputs the generated signal of the predetermined set frequency as the output signal, and wherein the information signal is a control signal that is output from the automatic gain controller for controlling the gain of the amplifier.

* * * * *